United States Patent [19]

Baber

[11] 4,448,636

[45] May 15, 1984

[54] LASER ASSISTED LIFT-OFF

[75] Inventor: Samuel C. Baber, Richardson, Tex.

[73] Assignee: Texas Instruments Incorporated, Dallas, Tex.

[21] Appl. No.: 384,355

[22] Filed: Jun. 2, 1982

[51] Int. Cl.³ .................. B44C 1/22; C03C 15/00; B23K 9/00; B05D 5/12
[52] U.S. Cl. .................. 156/643; 156/644; 156/652; 156/655; 156/272.8; 156/344; 219/121 LH; 219/121 LM; 427/88; 427/53.1
[58] Field of Search ............. 156/643, 644, 650–653, 156/654–657, 668, 272.8, 344; 430/313, 314, 430/315, 316, 317, 318; 204/192 EC; 427/88–90, 427/53.1; 219/121 LH, 121 LJ, 121 LM

[56] References Cited

U.S. PATENT DOCUMENTS

| | | | |
|---|---|---|---|
| 3,723,277 | 3/1973 | Schmiedecke | 204/192 EC |
| 3,748,246 | 7/1973 | Goell | 204/192 EC |
| 3,790,744 | 2/1974 | Bowen | 219/121 LJ |
| 4,119,483 | 10/1978 | Hubsch et al. | 156/668 X |

*Primary Examiner*—William A. Powell
*Attorney, Agent, or Firm*—Robert Groover; Melvin Sharp; James T. Comfort

[57] ABSTRACT

A method for selective removal of metallization in integrated circuits. A uniform metal film is applied over a patterned resist layer. A short pulse of radiant energy is then applied to the whole surface of the metal film. The resist underneath the metal film is locally heated enough to cause outgassing, which breaks the mechanical bond between the metal film and the resist. The metal film over the patterned resist layer is then removed, leaving the deposited metal film in place over areas which were not covered by the resist film.

17 Claims, 4 Drawing Figures

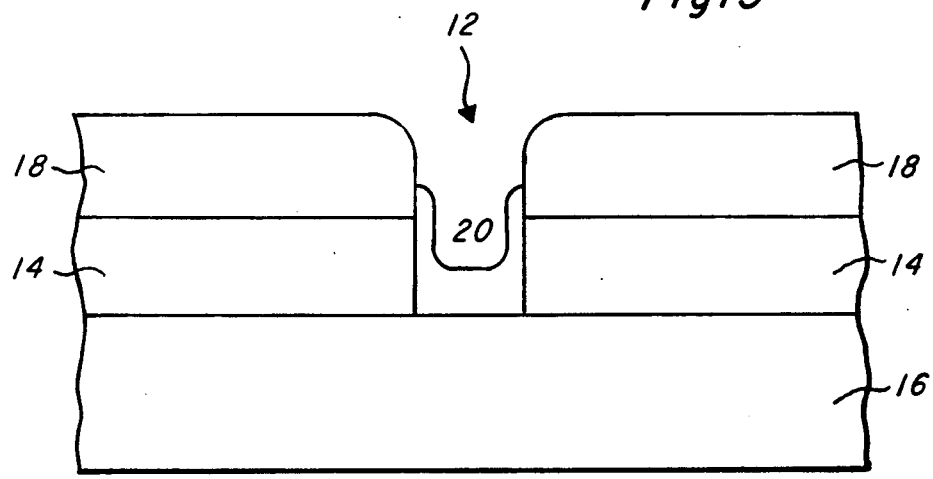
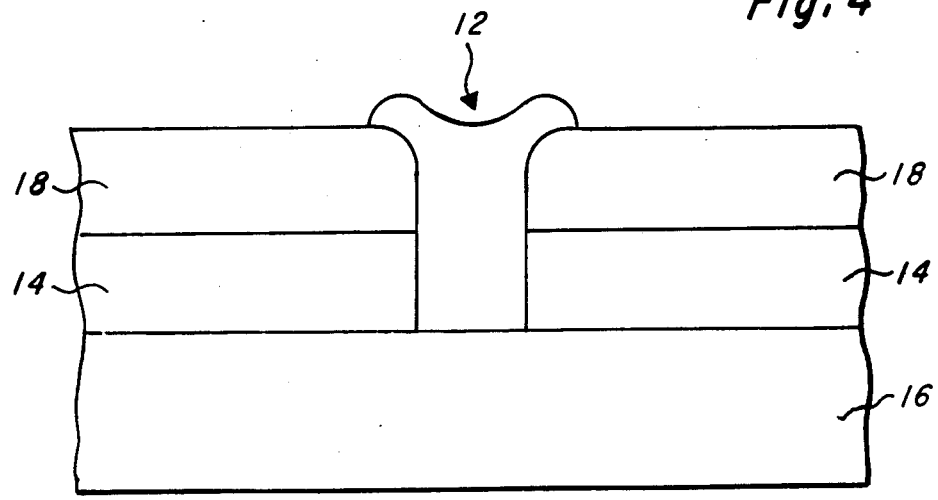

LASER ASSISTED LIFT-OFF

BACKGROUND OF THE INVENTION

The present invention relates to a method for patterning metal layers in integrated circuits.

A problem area of particular importance is the fabrication of VLSI structures having more than two levels of wiring. The additional design flexibility offered by a technology which includes three levels of wiring (such as polysilicon plus two levels of metal, or two levels of polysilicon plus metal) is extremely convenient in designing complex random logic, such as microprocessors, and can not only reduce required design time, but also raise the available performance of resulting circuits, since faster routings, avoiding propagation delays, can often be used. However, in such a multi-level structure, the vertical topographical excursion of the upper levels becomes quite large. This can impose considerable difficulties in step coverage, since the vertical height which may be exposed to the step may be very large. Moreover, this vertical excursion may cause disastrous focusing problems, since the vertical excursion of the uppermost metal layer may exceed the depth of field of normal projection exposure systems.

Thus, it would be highly desirable to have a convenient method for patterning small-geometry metal contacts, vias, and wiring lines.

It is an object of the present invention to provide a method for patterning metal films in integrated circuits at small geometries.

It is a further object of the present invention to provide a method for patterning metal films in integrated circuits which can cover very large vertical steps.

A method which has been previously proposed to accomplish these first two objectives is lift-off patterning. In the conventional methods, a patterned resist layer is applied, a metal film is deposited overall, and the resist is then removed with solvent. This requires a relatively long resist removal step, and the separation of the metal at the edges of the pattern resist is tricky. Moreover, extremely good control of the resist job is required. Efforts have been made to achieve the necessary resist control by using double resist techniques, but these lead to additional process complexity and are not yet proven. For further background on prior art lift-off techniques, see generally *Semiconductor International,* Dec. 1981, pp. 72–88.

It is an object of the present invention to provide a lift-off technique which does not require extremely precise control of resist sidewall profiles.

It is a further object of the present invention to provide a lift-off technique which does not require multi-level resist technology.

It is a further object of the present invention to provide a lift-off technique which does not remove the patterned resist layer.

It is a further object of the present invention to provide a lift-off technique which does not require introduction of solvent to cause an underlying resist layer to swell.

It is a further object of the present invention to provide a lift-off technique which reliably separates the metal at the edges of the patterned resist layer.

It is a further object of the present invention to provide a method for patterning metals, such as tungsten which are difficult to etch selectively.

It is a further object of the present invention to provide a method for patterning high-thermal-conductivity materials other than metals.

It is a further object of the present invention to provide a method for patterning silicides.

It is a further object of the present invention to provide a method for selectively removing portions of a uniform silicide layer, on an integrated circuit.

It is a further object of the present invention to provide a method for selectively depositing silicides over high-thermal-conductivity areas of an integrated circuit without any selective etching step.

It is a further object of the present invention to provide a method for selectively depositing silicides over high thermal-conductivity areas of an integrated circuit without any etching step.

SUMMARY OF THE INVENTION

The present invention provides a method for selective removal of metallization in integrated circuits. A uniform metal film is applied over a patterned resist layer. A pulse of radiant energy is then applied to the whole surface of the metal film. The resist underneath the metal film is locally heated enough to cause outgassing, which breaks the mechanical bond between the metal film and the resist. The metal film over the patterned resist layer is then floated off, leaving the deposited metal film in place over areas which were not covered by the resist film.

According to the present invention there is provided: a method for patterning high-thermal-conductivity films in integrated circuit processing, comprising the steps of: providing a substrate having an integrated circuit surface; providing a patterned layer of organic polymer on the surface; depositing a thin film of a high-thermal-conductivity material overall; heating the thin film with a pulse of radiation, whereby portions of the polymer in contact with the film are heated to break adhesion between the film and the polymer; and removing separated portions of the film from the polymer layer.

BRIEF DESCRIPTION OF THE DRAWINGS

The present invention will be described with reference to the accompanying drawings, wherein:

FIG. 3 shows the portion of the metal layer 20 remaining after the irradiation step and separation of excess metal have been performed; and FIG. 4 shows an example of a metal structure produced by repeated application of the method of the present invention.

DESCRIPTION OF THE PREFERRED EMBODIMENTS

The present invention is used for forming contacts, forming vias, forming metal wiring, and for planarizing recessed areas by filling them with metal. The invention will be first described with reference to formation of contact metallization.

Figure 1:
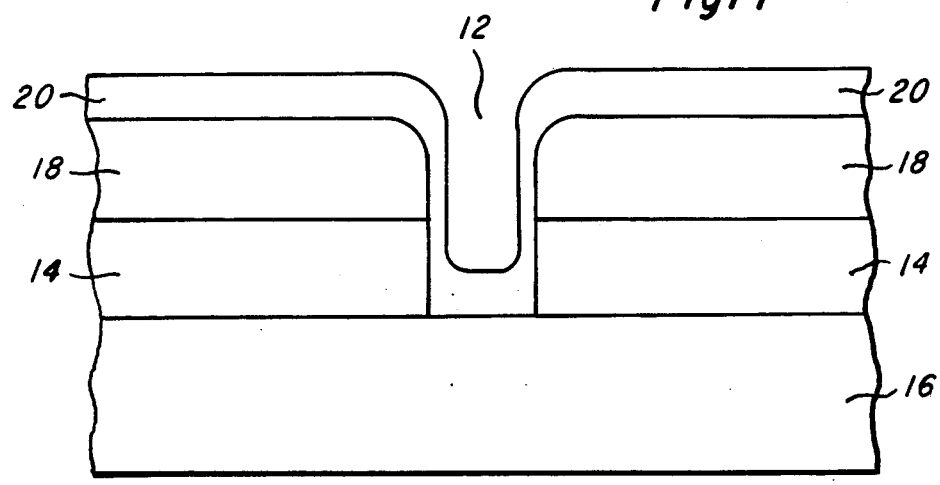
FIG. 1 shows a first step in the method of the present invention, where a layer 20 of metal has been deposited over a patterned photoresist etch mask 18.
Figure 2:
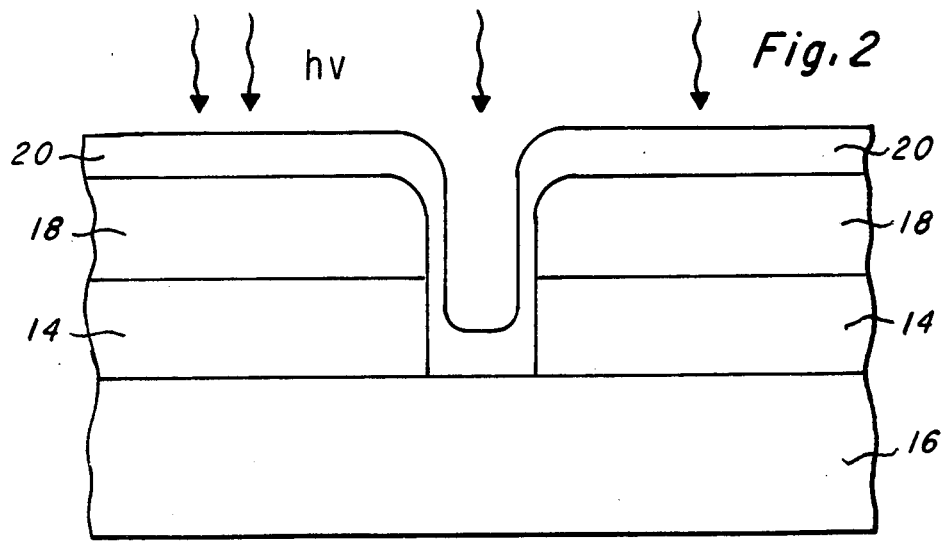
FIG. 2 shows radiant illumination of the structure of FIG. 1.

FIGS. 1 and 2 show the application of the present invention to formation of a metal contact. On a semiconductor substrate, such as silicon, where (for example) a contact is desired to be formed in an area 12 wherein insulator 14 is to be etched away to expose the substrate 16, a resist layer 18 is deposited and patterned to expose the desired contact hole 12. The insulator is then etched to expose the area 12, using the resist layer 18 as a mask. A uniform layer 20 of metal is then deposited conformally overall, by conventional methods.

A pulse of radiant energy is then applied over a wide area. This pulse may be applied over the whole wafer area simultaneously, or may be stepped if the pulse energy of the most convenient radiant energy source so dictates. Stepping can also be used to perform lift-off over only a fraction of the wafer. The energy of the pulse is preferably about 0.1 to 0.2 Joules per square centimeter, and may be much lower. The duration of the pulse is preferably less than a microsecond, but may optionally be longer.

Two relevant effects occur when the radiant energy pulse is applied. First, the portion of the resist layer 18 immediately adjacent to the metal layer 20 will be partially volatilized, freeing up the metal layer. Second, the thinner "wing" portions of the metal near the contact hole will be broken, usually by thermal shock. These two effects have different sensitivities to the pulse duration used.

A relatively short laser pulse assists in achieving clean separation of the wings. However, a much longer pulse can be used to achieve the basic lift-off step, since separation of the metal/resist bond merely depends on localized heating of the resist at the interface. Thus, not only is a Q-switched laser unnecessary for lift-off, but a slow flashlamp, having a duration as long as 100 milliseconds, will achieve lift-off if the total energy density is sufficient. Alternatively, a flip-oven can be used, where mechanical shutters, positioned between a wafer and a black-body radiant heat source, are opened for a period of milliseconds or seconds.

The maximum pulse heating duration which can be used is limited by the effects of bulk heating in the resist. That is, when a longer pulse is used, thermal relaxation will mean that a higher temperature exist through the whole resist layer when the desired temperature at the resist/metal interface (to cause outgassing) has been achieved. Such bulk heating of the resist is not particularly desirable if the deposition and pulsed illumination steps are to be repeated a large number of times. Moreover, where the pulse duration is long, the power density must be raised to attain the same maximum temperature at the resist interface. This is because thermalization will, as noted, distribute more heat into the bulk of the resist before the end of the pulse.

However, the bulk resist heating induced by a long pulse is used to advantage, in an alternative embodiment of the invention. In this alternative embodiment, a relatively long pulse is used, to induce bulk heating in the resist and consequent resist swelling. This resist swelling reliably separates the wings to the contact hole, since the ring of thin material around the contact hole will take almost all of the vertical strain imposed by the resist swelling.

Moreover, a clean separation of the wings is not strictly necessary in practicing the present invention, since the resist remains in place. Thus, where wings occur, they will be positioned as shown in FIG. 3. This means that a short post-etch can be used to remove the wings, without degrading the linewidth of the patterning. This is because the sides of the aluminum locations are protected by resist, so that only the wings and the uppermost surface of the deposited aluminum are attacked.

The present invention can also be applied repeatedly, to sequentially deposit and selectively remove thin layers of metal. This embodiment of the invention has several advantages. First, where each sequentially deposited layer of metal is quite thin, separation of the wings in each layer is easier. Thus, multiple layers of metal may be deposited, and lifted off using a cheap high-power flashlamp, to achieve clean deposition of a large total thickness of metal. Second, such repeated deposition can be used to deposit a multilayer stack of different metals. For example, a first metal might be deposited to achieve good ohmic contact, a second metal might be deposited for a diffusion barrier, and a third metal could then be deposited for low-resistance wiring.

In a sample embodiment of the present invention, a 1500 nm thick layer of organic photoresist (e.g. AZ 1350) is spun on, patterned, ashed, and baked. A 500 nm thick layer of a desired metal, for example TiW, is then deposited by evaporation. (Sputtering or other conventional methods are also alternative methods of metal deposition.) A Q-switched ruby laser is then used to apply pulsed illumination at a power density of about 0.2 Joules per square centimeter and a pulse duration of 20–30 nanoseconds. The metal above the patterned resist is thereby separated, and is gently removed using a low-velocity airstream. The metal deposition, pulsed illumination, and remove steps are then sequentially repeated until the desired thickness of patterned metal has been deposited. The process is optionally repeated to achieve the total patterned metal thickness of desired. The resist layer is then removed, the slice is cleaned, and processing proceeds with further steps according to the conventional art of semiconductor integrated circuit fabrication.

Note that the incident power density must be adjusted, according to conventional optical engineering practice, to compensate for the different reflectivities of the materials used. For example, since TiW absorbs most of the incident power at visible and near IR wavelengths, almost all of the incident power translates into absorbed power. By contrast, where a more reflective metal such as aluminum or gold is used, a large percentage of the incident power is reflected. The incident power must therefore be raised, to provide an absorbed power which is sufficient to raise the temperature at the resist interface sufficiently high to produce outgassing and expansion.

A further way to lower the required power density in practicing the present invention is to select a resist for outgassing and expansion. Outgassing is not a particularly desirable property of normal resists, but, for practicing the present invention, a resist which produces out-gassing at lower absolute temperatures permits use of a lower incident energy density. However, it is preferable that any such alternative resist retain good durability, so that the same resist may be used in a self-aligned process, as discussed above, both to pattern an etching step and to pattern deposition of metal. Moreover, the thermal conductivity of the resist should preferably be as low as possible and the thermal expansion coefficient be large.

A related embodiment of the present invention is use of resist which contains a higher than normal percentage of solvent. That is, the bake period normally used may be reduced, so that more solvent remains in the resist, and the resist will therefore outgas solvent more easily. However, excessive additional solvent will tend to raise the thermal conductivity of the resist layer and lower durability.

Thermally induced expansion of the resist aids in separation of the metal over adjacent to heat sinked areas. However, such resist expansion requires a larger amount of heat to be coupled into the resist, which means that a high repetition rate of selected metal removal steps cannot be used.

When long-pulse cheap heat radiation sources are used, the mechanical tension plays a major part in separating the metal rings. To assist in accomplishing the present invention with cheap radiation sources, it is preferable to use a metal having relatively low ductility and tensile strength.

The present invention has been described with a primary reference to metals, since metallization patterning is a key need of semiconductor integrated circuit processing. However, the present invention is also very advantageously applied to silicides. Silicides also have relatively high thermal conductivity, and have the further advantage of lower tensile strength and ductility. Thus, separation of the wings adjacent to heat-sinked areas is much more easily achieved.

The key difficulty in applying the present invention to silicides is the low-temperature silicide deposition which is required to lay down silicide over resist. Co-sputtering is preferred way to accomplish low-temperature pattern silicide deposition over resist. However, low temperature chemical vapor deposition processes may alternatively be used.

Some examples of silicides which may be selectively removed using the present invention include titanium silicide, platinum silicide, palladium silicide, molybdenum silicide, nickel silicide, and cobalt silicide.

A further alternative of the embodiment of the present invention uses a high-temperature organic polymer, such as polyimide, in place of the photoresist layer 18. This permits a metal or silicide layer 20 to be sputtered onto a higher substrate temperature, resulting in better crystal quality.

The physical structure of FIGS. 1–4 shows a simplified example of an integrated circuit structure to which the present invention is applied, but the present invention can also be applied to more complex structures. The key feature is that a desired material is applied uniformly over a patterned polymer layer, and then uniformly irradiated to separate the bond between the polymer and the thin layer, so that the desired material is ultimately left only on areas exposed by the patterned polymer layer. This method may be used to form contacts in context of well known silicon processing steps, but may also be used in gallium arsenide processing, in silicon on insulator technology, and in a wide variety of other technologies. For example, the method of the present invention is particularly useful in depositing metals such as tungsten and gold, which are useful in gallium arsenide processing but are difficult to etch. Note also that it is not strictly necessary for the areas exposed by the photoresist (or polymer) pattern to have very high thermal conductivity. High thermal conductivity in exposed areas aids in avoiding mechanical strain where the film 20 makes contact to the underlying portion of the integrated circuit structure, and aids in preventing premature separation of the resist layer 18 from the sides of the portion of metal layer 20 which is left in place, but is not strictly necessary for practice in the present invention. The present invention provides a general method of performing lift-off, and is therefore applicable to any structure where a high-thermal-conductivity material must be selectively deposited. Thus, the present invention can be used to deposit metal or silicide on silicon, polysilicon, intermediate metal or silicide layers, silicon dioxide, silicon nitride, lithium niobate, HgCdTe or other material.

In addition, the present invention is applicable not only to selectively deposit metals, intermetallic compounds, or silicides, but is also applicable to selectively deposit compounds of other varieties, such as semiconductors or insulators. For example, the present invention is applied, in one alternative embodiment, to pattern extremely fine lines of polysilicon for fuses. The present invention can also be applied to pattern insulators, particularly such high-thermal-conductivity insulators as beryllium, aluminum, or titanium oxides. While it is desirable that the material being selectively deposited should have a reasonably high thermal conductivity, this too is not a strict requirement. It is desirable that the material being deposited should have a thermal conductivity which is at least comparable to that of the photoresist, so that the desired high temperature at the photoresist interface can be attained with a relatively small total energy density. If materials with a relatively low thermal conductivity are used, the maximum thickness of deposited material which can be patterned at any one time is simply reduced accordingly.

Thus, as discussed above, the method of the present invention can be applied in alternative embodiments over an extremely wide range of parameters. Where metal is selectively deposited over a conventional photoresist, the preferred embodiment uses pulsed illumination with a pulse duration of less than one microsecond and an absorbed power density of 0.01 through one Joule per square centimeter. Preferably, the areas exposed by the patterned photoresist should have a relatively high thermal conductivity, but this is not strictly necessary to the practice of the present invention. Preferably, the deposited material should have a conductivity which is at least comparable to that of photoresist, but this too is not strictly necessary to the practice of the present invention. The wavelength of radiant illumination is almost completely irrelevant, as long as the wavelength is not a large multiple of the thickness of the layer of material which is to be patterned. Where long pulsed illumination is used, a minimum power density, of at least 100 watts per square centimeter, is also preferable. In short-pulse embodiments, the power density may be as high as a billion watts per square centimeter. In addition, by use of unconventional polymer materials which outgas at a lower temperature than conventional photoresists, the power density and energy density minima referred to above may be further reduced.

It will be apparent to those skilled in the art that a wide range of modifications and variations may be introduced in practicing the present invention. Since the present invention provides a fundamental new capability in metal patterning for semiconductor processing, many specific embodiments and alternatives lie within the scope of the present invention.

What I claim is:

1. A method for patterning thin films in integrated circuit processing, comprising the steps of:
    providing a substrate having an integrated circuit surface;

providing a patterned layer of organic polymer on said surface;

depositing a thin film of a preselected material both over portions of said patterned layer of organic polymer and also over poritons of said substrate which are not covered by said patterned layer of organic polymer;

heating said thin film with a pulse or radiation, whereby portions of said polymer in contact with said film are heated to break adhesion between said film and said polymer; and removing separated portions of said film from said polymer layer.

2. The process of claim 1, wherein said polymer layer lies on an insulator layer on said substrate, and further comprising the step of etching a hole in said insulator layer where exposed by said patterned polymer layer, prior to said step of applying said thin film.

3. The process of claim 1, further comprising the step of:

post-etching said thin film, after said step of removing separated portions of said thin film from said polymer.

4. The process of claim 1, further comprising the steps of:

depositing a second thin film of a preselected material both over portions of said patterned layer of organic polymer and also over portions of said substrate which are not covered by said patterned layer of organic polymer;

heating said second film with pulse of radiation; and removing separated portions of said second film from said polymer layer.

5. The process of claim 1, 2, 3, or 4 wherein at least one said thin film comprises a metal silicide.

6. The process of claim 5, wherein said metal silicide is selected from the group consisting of titanium silicide, platinum silicide, palladium silicide, molybdenum silicide, cobalt silicide, nickel silicide and tungsten silicide.

7. The process of claim 1, 2, 3, or 4, wherein at least one said thin film comprises a metal.

8. The process of claim 7, wherein said metal is a refractory metal.

9. The process of claim 8, wherein said metal is selected from the group consisting of tungsten, molybdium, and cobalt.

10. The process of claim 7, wherein said metal is a noble metal.

11. The process of claim 10, wherein said metal is selected from the group consisting of platinum, iridium, osmium, palladium, rhodium, and rhenium.

12. The process of claim 4, wherein said polymer comprises organic photoresist.

13. The process of claim 1, 2, 3, or 4, wherein said organic polymer comprises polyimide.

14. The process of claim 7, wherein said metal comprises an alloy of titanium and tungsten.

15. The method of claim 1, wherein said pulse applies an absorbed energy density to said thin film which is in the range of 0.01–1 Joules per square centimeter.

16. The process of claim 1, wherein said pulse has a duration which is less than one microsecond.

17. The process of claim 1, wherein said pulse applies an absorbed power density to said thin film which is greater than 100 watts per square centimeter.

* * * * *